(12) United States Patent
Sugiura et al.

(10) Patent No.: US 11,752,734 B2
(45) Date of Patent: Sep. 12, 2023

(54) BASE MATERIAL FOR PRINTED CIRCUIT BOARD AND PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Motohiko Sugiura, Osaka (JP); Issei Okada, Osaka (JP); Kenji Ohki, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/766,877

(22) PCT Filed: Sep. 24, 2018

(86) PCT No.: PCT/JP2018/035237
§ 371 (c)(1),
(2) Date: May 26, 2020

(87) PCT Pub. No.: WO2019/130691
PCT Pub. Date: Jul. 4, 2019

(65) Prior Publication Data
US 2020/0324517 A1 Oct. 15, 2020

(30) Foreign Application Priority Data
Dec. 25, 2017 (JP) .................................. 2017-247549

(51) Int. Cl.
*B32B 15/08* (2006.01)
*H05K 1/03* (2006.01)
(Continued)

(52) U.S. Cl.
CPC .............. *B32B 15/08* (2013.01); *B32B 27/14* (2013.01); *B32B 27/281* (2013.01);
(Continued)

(58) Field of Classification Search
CPC .............. B32B 15/08; B32B 2264/105; B32B 2457/08; B32B 27/14; B32B 27/281;
(Continued)

(56) References Cited

U.S. PATENT DOCUMENTS 5,133,840 A * 7/1992 Buchwalter ................ C08J 7/12
205/167
10,225,931 B2 3/2019 Hashizume et al.
(Continued)

FOREIGN PATENT DOCUMENTS

JP 2007-012590 1/2007
JP 2012-142318 7/2012
(Continued)

OTHER PUBLICATIONS

Harcarik, M., Jankovych, R. "Relationship between values of profile and areal surface texture parameters." MM Sci. J 5 (2016): 1659-1662. (Year: 2016).*
(Continued)

*Primary Examiner* — John D Freeman
(74) *Attorney, Agent, or Firm* — IPUSA, PLLC

(57) ABSTRACT

A base material for a printed circuit board includes: an insulating base film; and a sintered body layer of metal particles layered on one side surface of the base film; wherein an arithmetic mean roughness (Sa) of a surface of the sintered body layer that is opposite to the base film is greater than or equal to 0.005 μm and less than or equal to 0.10 μm.

7 Claims, 2 Drawing Sheets

(51) Int. Cl.
  *H05K 1/09* (2006.01)
  *B32B 27/28* (2006.01)
  *B32B 27/14* (2006.01)

(52) U.S. Cl.
  CPC .......... *H05K 1/0353* (2013.01); *H05K 1/09* (2013.01); *B32B 2264/105* (2013.01); *B32B 2264/1055* (2020.08); *B32B 2264/301* (2020.08); *B32B 2264/302* (2020.08); *B32B 2307/538* (2013.01); *B32B 2457/08* (2013.01); *H05K 2201/0154* (2013.01)

(58) Field of Classification Search
  CPC ...... B32B 2264/1055; B32B 2264/301; B32B 2264/302; B32B 2307/538; H05K 1/0353; H05K 1/09; H05K 2201/0154; H05K 2201/0257; H05K 3/022; H05K 3/388; H05K 2201/0338
  See application file for complete search history.

(56) References Cited

U.S. PATENT DOCUMENTS

| | | | |
|---|---|---|---|
| 2004/0004209 A1* | 1/2004 | Matsuba | B22F 1/102 252/518.1 |
| 2009/0197045 A1 | 8/2009 | Okada et al. | |
| 2017/0347464 A1* | 11/2017 | Hashizume | H05K 3/38 |
| 2018/0315519 A1 | 11/2018 | Sugiura et al. | |
| 2018/0371191 A1 | 12/2018 | Hashizume et al. | |

FOREIGN PATENT DOCUMENTS

| | | | |
|---|---|---|---|
| JP | 2013-164990 | 8/2013 | |
| JP | 2014-110514 | 6/2014 | |
| JP | 2016-152405 | 8/2016 | |
| JP | 2016-225524 | 12/2016 | |
| WO | WO-2016104420 A1 * | 6/2016 | .............. H05K 1/03 |
| WO | 2016/194972 | 12/2016 | |
| WO | 2017/057301 | 4/2017 | |
| WO | 2017/090625 | 6/2017 | |

OTHER PUBLICATIONS

Japanese Industrial Standards Committee, "Product Geometric Specifications (GPS)-Surface Properties: 3D-Part 2 Terminology, Definitions and Surface Properties Parameters", Jis B 0681-2:2018 (Mar. 20, 2018) Retrieved from <https://webdesk.jsa.or.jp/preview/pre_jis_b_00681_002_000_2018_j_ed10_ch.pdf> With English Translation.

Yoshida et al., "Surface property evaluation parameters of the shotblasted surface", Light metals, vol. 61, No. 5, pp. 187-191 (May 2011) Retrieved from <https://www.jstage.jst.go.jp/article/jilm/61/5/61_5_187/_pdf/-char/ja> With English Translation.

* cited by examiner

BASE MATERIAL FOR PRINTED CIRCUIT BOARD AND PRINTED CIRCUIT BOARD

TECHNICAL FIELD

The present disclosure relates to a base material for a printed circuit board and a printed circuit board. The present application is based on and claims priority to Japanese Patent Application No. 2017-247549, filed on Dec. 25, 2017, the entire contents of the Japanese Patent Application are hereby incorporated herein by reference.

BACKGROUND ART

As a base material for a printed circuit board for which a sputtering method is not used, a base material for a printed circuit board including an insulating resin film and a sintered body layer of metal particles layered on one side surface of the resin film and a base material for a printed circuit board further including a metal plating layer on a surface of the sintered body layer that is opposite to the base film are proposed (see International Publication Pamphlet No. WO 2016/194972). The sintered body layer is formed by applying a conductive ink containing metal particles to one side surface of the resin film and heating it.

PRIOR ART DOCUMENT

Patent Document

[Patent Document 1] International Publication Pamphlet No. WO 2016/194972

SUMMARY OF THE INVENTION

According to one aspect of the present disclosure, a base material for a printed circuit board includes: an insulating base film; and a sintered body layer of metal particles layered on one side surface of the base film; wherein an arithmetic mean roughness (Sa) of a surface of the sintered body layer that is opposite to the base film is greater than or equal to 0.005 μm and less than or equal to 0.10 μm.

According to another aspect of the present disclosure, a printed circuit board includes: an insulating base film; a sintered body layer of metal particles layered on one side surface of the base film; and a plating layer that is layered on a surface of the sintered body layer that is opposite to the base film, wherein the sintered body layer and the plating layer are patterned in plan view, and wherein an arithmetic mean roughness (Sa) of the surface of the sintered body layer that is opposite to the base film is greater than or equal to 0.005 μm and less than or equal to 0.10 μm.

EMBODIMENT FOR CARRYING OUT THE INVENTION

Figure 1:
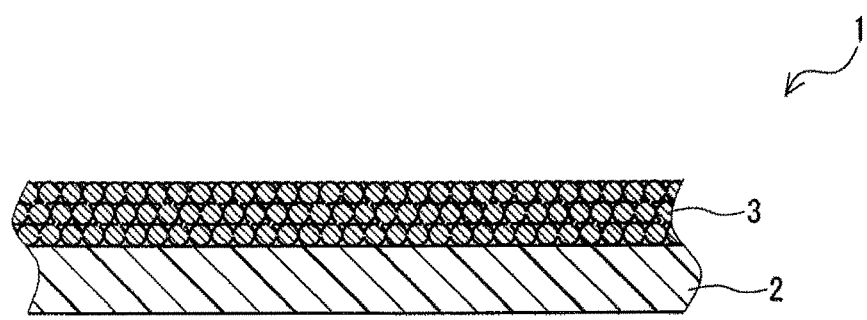
FIG. 1 is a schematic cross-sectional view illustrating a base material for a printed circuit board according to one embodiment of the present disclosure.

Problem to be Solved by the Present Disclosure

There is known a base material for a printed circuit board including an insulating base film and a metal layer layered on one side surface of the base film.

Conventionally, as a base material for a printed circuit board, one in which a seed layer is formed on one side surface of a base film by a sputtering method is used. However, manufacturing of the base material for a printed circuit board using the sputtering method requires expensive vacuum equipment required for physical vapor deposition. Today, a relatively inexpensive base material for a printed circuit board is proposed that is manufactured without the use of a sputtering method.

The base material for a printed circuit board disclosed in Patent Document 1 includes a modified layer formed by an alkali treatment or the like on a surface of a resin film on which a sintered body layer is layered. In this base material for a printed circuit board, the modified layer includes a metal, a metal ion, or a metal compound different from the main metal of the sintered body layer. As a result, the adhesion of the resin film and the sintered body layer of the base material for a printed circuit board is enhanced.

However, the inventors of the present invention have carefully studied and found that in a case in which a conductive ink containing metal particles is applied to a resin film and heated to form a sintered body layer, it is difficult to sufficiently increase the density of the coating film formed by applying the ink, and it is difficult to sufficiently increase the density of the obtained sintered body layer. Accordingly, it has been found that this base material for a printed circuit board has a further problem in enhancing the adhesion between the resin film and the sintered body layer and in reducing the resistance of the sintered body layer.

Therefore, the present disclosure has an object to provide a base material for a printed circuit board and a printed circuit board excellent in adhesion of a base film and a sintered body layer of metal particles and having low resistance of the sintered body layer.

Effect of the Present Disclosure

A base material for a printed circuit board and a printed circuit board according to the present disclosure are excellent in adhesion of a base film and a sintered body layer of metal particles and have low resistance of the sintered body layer.

Description of Embodiments of the Present Invention

First, aspects of the present disclosure will be listed and described.

According to one aspect of the present disclosure, a base material for a printed circuit board includes: an insulating base film; and a sintered body layer of metal particles layered on one side surface of the base film; wherein an arithmetic mean roughness (Sa) of a surface of the sintered body layer that is opposite to the base film is greater than or equal to 0.005 μm and less than or equal to 0.10 μm.

According to the base material for a printed circuit board, because the arithmetic mean roughness (Sa) of the surface of the sintered body layer that is opposite to the base film is within the above range, the metal particles constituting the sintered body layer are densely disposed with a high density. Therefore, in the base material for a printed circuit board, the resistance of the sintered body layer is small. In addition, because the interface between the base film and the sintered body layer is densely formed, the base material for a printed circuit board is excellent in adhesion of the base film and the sintered body layer.

The sintered bodies constituting the sintered body layer are preferably copper particle sintered bodies, and the average particle size of the copper particle sintered bodies is preferably greater than or equal to 50 nm and less than or equal to 300 nm. By the sintered bodies constituting the sintered body layer being copper particle sintered bodies and the average particle size of the copper particle sintered bodies being within the above described range, it is easy to dispose metal particles constituting the sintered body layer at a high density. Therefore, it is possible to increase the density of the sintered body layer, reduce the resistance of the sintered body layer, and increase the adhesion of the base film and the sintered body layer.

The main component of the base film is preferably a polyimide, and the ring opening rate of the imide rings of the polyimide of the surface layer of the one side surface of the base film is preferably greater than or equal to 10% and less than or equal to 30%. By the main component of the base film being a polyimide, and the ring opening rate of the imide rings of the polyimide of the one side surface of the base film being within the above described range, the adhesion of the base film and the sintered body layer can be further increased.

The content of palladium in the vicinity of the one side surface of the base film is preferably less than or equal to 1.0 mg/m². By the content of palladium in the vicinity of the one side surface of the base film being less than or equal to the upper limit, in a case in which a printed circuit board is formed from the base material for a printed circuit board, it is not required to perform etching to remove palladium in addition to etching of the sintered body layer. Therefore, it is possible to easily and inexpensively form a printed circuit board.

According to another aspect of the present disclosure, a printed circuit board includes: an insulating base film; a sintered body layer of metal particles layered on one side surface of the base film; and a plating layer that is layered on a surface of the sintered body layer that is opposite to the base film, wherein the sintered body layer and the plating layer are patterned in plan view, and wherein an arithmetic mean roughness (Sa) of the surface of the sintered body layer that is opposite to the base film is greater than or equal to 0.005 μm and less than or equal to 0.10 μm.

According to the printed circuit board, because the arithmetic mean roughness (Sa) of the surface of the sintered body layer that is opposite to the base film is within the above range, the metal particles constituting the sintered body layer are densely disposed with a high density. Therefore, in the printed circuit board, the resistance of the sintered body layer is small. Also, because the interface between the base film and the sintered body layer is densely formed, the printed circuit board is excellent in adhesion of the base film and the sintered body layer.

It should be noted that the "sintered body layer of metal particles" refers to a layer formed by sintering a plurality of metal particles. The "sintering" includes not only making a completely sintered state in which particles are tightly bonded together but also includes a state in which particles are at a stage before reaching a completely sintered state and adhere to each other to form solid bonds. The "arithmetic mean roughness (Sa)" refers to a three-dimensional surface texture parameter defined in International Standard ISO25178, and a value that is measured in a measurement range of 30 μm×30 μm and a cutoff value of 90. The "average particle size of sintered bodies" means a particle size at which a volume integrated value is 50% in a particle size distribution measured by a surface SEM. The "main component" refers to a component whose content is the largest, and refers to, for example, a component whose content is greater than or equal to 50% by mass. The "ring opening rate of imide rings of polyimide" refers to a value that is measured by Fourier transform infrared total reflection absorption measurement (FT-IR-ATR). The "content of palladium" refers to a value that is measured by ICP emission spectroscopy (ICP-AES).

Details of Embodiment of the Present Disclosure

In the following, preferable embodiments of the present disclosure will be described with reference to the drawings.

First Embodiment

<Base Material for Printed Circuit Board>

A base material 1 for a printed circuit board illustrated in FIG. 1 includes an insulating base film 2 and a sintered body layer 3 of metal particles layered on one surface of the base film 2. The base material 1 for a printed circuit board is a base material for a flexible printed circuit board and has flexibility. In the base material 1 for a printed circuit board, an arithmetic mean roughness (Sa) of the surface of the sintered body layer 3 that is opposite to the base film 2 is greater than or equal to 0.005 μm and less than or equal to 0.10 μm.

In the base material 1 for a printed circuit board, because the arithmetic mean roughness (Sa) of the surface of the sintered body layer 3 that is opposite to the base film 2 is within the above range, the metal particles constituting the sintered body layer 3 are densely disposed with a high density. Therefore, in the base material 1 for a printed circuit board, the resistance of the sintered body layer 3 is small. Also, because the interface between the base film 2 and the sintered body layer 3 is densely formed, the base material 1 for a printed circuit board is excellent in adhesion of the base film 2 and the sintered body layer 3.

(Base Film)

The base film 2 is insulating and flexible. The main component of the base film 2 is a synthetic resin. Examples of the main component of the base film 2 include a soft material such as polyimide, liquid crystal polyester, polyethylene terephthalate, polyethylene naphthalate, fluoropolymer, and the like. Among these, polyimide that is excellent in heat resistance and adhesion to the sintered body layer 3 is particularly preferable.

As the polyimide, a thermosetting polyimide (also referred to as a condensation polyimide) or a thermoplastic polyimide can be used. Among them, a thermosetting polyimide is preferable in terms of heat resistance, tensile strength, tensile elastic modulus, and the like.

The polyimide may be a homopolymer consisting of a single type of structural unit, a copolymer consisting of two or more types of structural units, or may be a blend of two or more types of homopolymers. It is preferable that the polyimide includes the structural unit that is represented by the following formula (1) or (2).

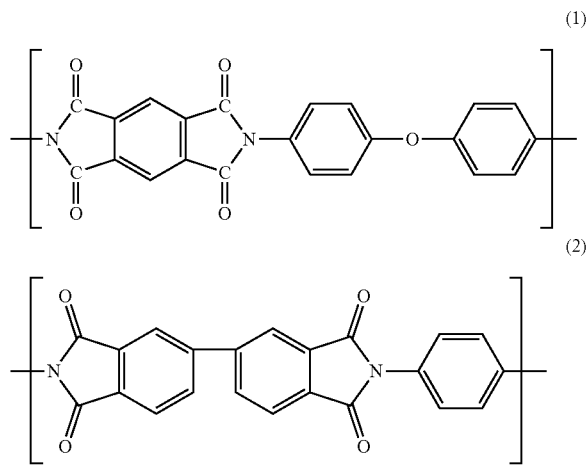

The structural unit that is represented by the formula (1) is obtained, for example, by using pyromellitic acid dihydrate and 4,4'-diaminodiphenyl ether to synthesize polyamic acid that is a polyimide precursor and imidizing it by heating or the like. Also, the structural unit that is represented by the formula (2) can be obtained, for example, by imidizing by heating polyamic acid synthesized using 3,3',4,4'-biphenyltetracarboxylic dianhydride and p-phenylenediamine.

The lower limit of the content of the above described structural unit is preferably 10% by mass, is more preferably 15% by mass, and is further more preferably 18% by mass. The upper limit of the content of the above described structural unit is preferably 50% by mass, is more preferably 40% by mass, and is further more preferably 35% by mass. When the content of the structural unit is less than the lower limit, the strength of the base film 2 may be insufficient. When the content of the structural unit exceeds the upper limit, the flexibility of the base film 2 may be insufficient.

It is preferable that the surface layer of the one side surface of the base film 2 is modified so that a portion of the imide rings of the polyimide is open. Examples of a modification treatment method of modifying the surface layer of the one side surface of the base film 2 include known treatment methods, such as alkali treatment and a plasma treatment. In particular, an alkali treatment is preferable. As will be described later, for the base material 1 for a printed circuit board, by applying a conductive ink containing metal particles to the one side surface of the base film 2 and then sintering the coating film formed by the ink, the sintered body layer 3 is formed. In this regard, generally, when the surface layer of the one side surface of the base film is modified by an alkali treatment, an alkali component used in the alkali treatment is mixed in a coating film, thereby inhibiting the density of the coating film. Therefore, in a case in which the surface layer of the one side surface of the base film is modified by the alkaline treatment, it is difficult to obtain a sufficiently dense sintered body layer. With respect to the above, for the base material 1 for a printed circuit board, as will be described later below, even in a case in which the surface layer of the one side surface of the base film 2 is modified by an alkali treatment, by increasing the density of the coating film, the sintered body layer 3 that is sufficiently dense can be formed.

In a case in which the surface layer of the one side of the base film 2 is modified, the lower limit of the ring opening rate of the imide rings of the polyimide of the surface layer on the one side surface of the base film 2 is preferably 10% and is more preferably 15%. The upper limit of the ring opening rate is preferably 30% and is more preferably 25%. When the ring opening rate is less than the lower limit, the adhesion of the base film 2 and the sintered body layer 3 may not be sufficiently enhanced. When the ring opening rate exceeds the upper limit, the strength of the base film 2 may be insufficient. It should be noted that adjustment of the ring opening rate can be performed, for example, by applying an alkali treatment using an alkali liquid, such as sodium hydroxide, to the one side surface of the base film 2. Also, the "ring opening rate of imide rings of polyimide of the surface layer of the one side surface of the base film" refers to the ring opening rate of the imide rings in a depth region of 50 nm or less from the one side surface of the base film. Also, using a Fourier transform infrared total reflection absorption measurement (FT-IR-ATR) device "Nicolet8700" manufactured by Thermo Fisher Scientific K.K., using a single-reflection ATR accessory "Dura Scope" (diamond prism) manufactured by SensIR cooperation, setting the absorption intensity spectrum in the range of the measurement wave number of 4000 to 650 $cm^{-1}$ at the incident angle of 45° to 16 times as the number of times of integration (the number of scans), setting the resolution to 4 $cm^{-1}$ for measurement, calculating, from the obtained absorption intensity spectrum, the ratio of the peak intensity at the wave number of 1705 $cm^{-1}$ to the peak intensity at the wave number of 1494 $cm^{-1}$, and converting the ratio of the peak intensity of the base film not subjected to the surface treatment to 100%, the ring opening rate of the imide rings can be obtained.

The upper limit of the content of palladium in the vicinity of the one side surface of the base film 2 is preferably 1.0 $mg/m^2$, is more preferably 0.5 $mg/m^2$, and is further more preferably 0.2 $mg/m^2$. The smaller the content of palladium in the vicinity of the one side surface of the base film 2, the better, and the lower limit of the content can be 0.0 $mg/m^2$. When the content of palladium in the vicinity of the one side surface of the base film 2 exceeds the upper limit, it is highly likely that performing of etching to remove palladium is required to be performed in addition to etching of the sintered body layer 3 in a case in which the base material 1 for a printed circuit board is used to form a printed circuit board. With respect to the above, by the content of palladium in the vicinity of the one side surface of the base film 2 being less than or equal to the upper limit described above, etching for removing palladium is not required to be performed and therefore, it is possible to easily and inexpensively form a printed circuit board. It should be noted that the "palladium content in the vicinity of the one side surface of the base film" refers to the content of palladium per unit area in the region of 50 nm vertically from the one side surface of the base film in the thickness direction. Also, the palladium content can be measured after the sintered body layer 3 layered on the one side surface of the base film 2 is removed by etching.

The thickness of the base film 2 is not particularly limited. For example, the lower limit of the average thickness of the base film 2 is preferably 5 μm and is more preferably 12 μm. The upper limit of the average thickness of the base film 2 is preferably 2 mm and is more preferably 1.6 mm. When the average thickness of the base film 2 is less than the lower limit, the strength of the base film 2 may be insufficient. When the average thickness of the base film 2 exceeds the upper limit, it may be difficult to be applied to an electronic device that is required to be reduced in thickness and the flexibility may be insufficient.

The lower limit of the arithmetic mean roughness (Sa) of the one side surface of the base film 2 is preferably 0.005 μm and is more preferably 0.010 μm. The upper limit of the arithmetic mean roughness (Sa) of the one side surface of the base film 2 is preferably 0.10 μm and is more preferably 0.05 μm. When the arithmetic mean roughness (Sa) is less than the lower limit, the base film 2 may not be easily formed. Also, when the arithmetic mean roughness (Sa) is less than the lower limit, the surface treatment on the one side surface of the base film 2 may be insufficient, and the adhesion of the base film 2 and the sintered body layer 3 may decrease. When the arithmetic mean roughness (Sa) exceeds the upper limit, the density of the interface between the base film 2 and the sintered body layer 3 may be insufficient, and the adhesion of the base film 2 and the sintered body layer 3 may be insufficient.

(Sintered Body Layer)

The sintered body layer 3 is layered directly on the one side surface of the base film 2 (i.e., without interposing another layer such as an adhesive layer). In the base material 1 for a printed circuit board, the sintered body layer 3 is adhered to the one side surface of the base film 2. Manufacturing of the base material 1 for a printed circuit board does not require expensive vacuum equipment required for physical vapor deposition as in the case of using a sputtering method, and thus the manufacturing cost can be suppressed.

The sintered body layer 3 has a structure in which a plurality of metal particles are adhered to each other by a metal oxide or the like. Examples of a metal constituting the metal particles include copper, nickel, aluminum, gold, silver, and the like. In particular, copper that is excellent in conductivity and adhesion to the base film 2 and etching properties is preferable. That is, it is preferable that the sintered bodies constituting the sintered body layer 3 are copper particle sintered bodies.

The lower limit of the average particle size of the copper particle sintered bodies is preferably 50 nm, and is more preferably 70 nm. The upper limit of the average particle size of the copper particle sintered bodies is preferably 300 nm, and is more preferably 200 nm. By the average particle size of the copper particle sintered bodies being within the range as described above, the sintered body layer 3 that is sufficiently dense can be formed, and the adhesion between the base film 2 and the sintered body layer 3 can be increased. Therefore, it is possible to promote the extension of the life of the base material 1 for a printed circuit board. It should be noted that although all the copper particle sintered bodies are preferably nanoparticles, they may contain nanoparticles and particles other than the nanoparticles (i.e., particles with particle sizes of 1000 nm or more). In a case in which the copper particle sintered bodies contain nanoparticles and particles other than the nanoparticles, the lower limit of the content rate of the nanoparticles with respect to 100 parts by mass of the total copper particle sintered bodies is preferably 70 parts by mass and is more preferably 90 parts by mass.

The lower limit of the average thickness of the sintered body layer 3 is preferably 50 nm, is more preferably 70 nm, and is further more preferably 100 nm. The upper limit of the average thickness of the sintered body layer 3 is preferably 1000 nm, is more preferably 700 μm, and is further more preferably 500 nm. When the average thickness of the sintered body layer 3 is smaller than the lower limit as described above, a break may occur in the sintered body layer 3 in plan view and the conductivity may decrease. When the average thickness of the sintered body layer 3 exceeds the upper limit as described above, for example, at the time of application for wiring formation by a semi-additive method, it may take a long time to remove the sintered body layer 3 between conductive patterns, and productivity may decrease.

The lower limit of the arithmetic mean roughness (Sa) of the surface of the sintered body layer 3 that is opposite to the base film 2 is 0.005 μm and is more preferably 0.009 μm. The upper limit of the arithmetic mean roughness (Sa) of the surface of the sintered body layer 3 that is opposite to the base film 2 is 0.10 μm and is more preferably 0.05 μm. When the arithmetic mean roughness (Sa) is smaller than the lower limit as described above, it may be difficult to form the sintered body layer 3. When the arithmetic mean roughness (Sa) exceeds the upper limit as described above, the density of the sintered body layer 3 may be insufficient, it may be difficult to sufficiently reduce the resistance of the sintered body layer 3, and the adhesion of the base film 2 and the sintered body layer 3 may be insufficient.

Second Embodiment

<Base Material for Printed Circuit Board>

Figure 2:
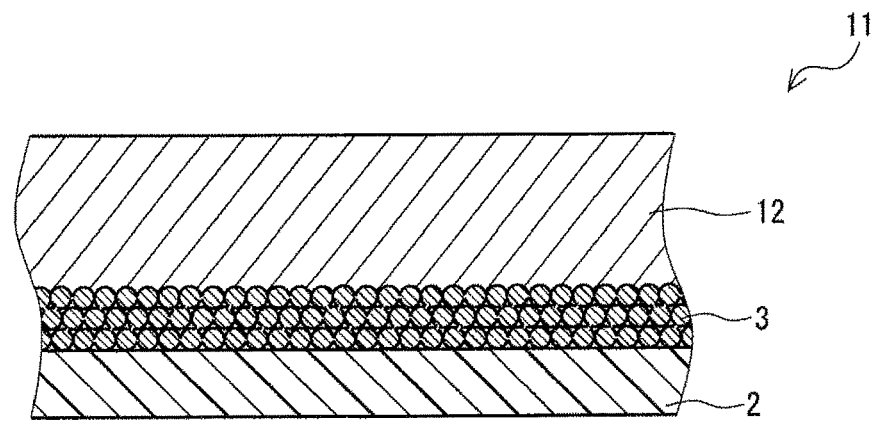
FIG. 2 is a schematic cross-sectional view illustrating a base material for a printed circuit board according to an embodiment different from that of the base material for a printed circuit board of FIG. 1.

A base material 11 for a printed circuit board of FIG. 2 includes: the base material 1 for a printed circuit board of FIG. 1; and a plating layer 12 that is layered on a surface of the sintered body layer 3 that is opposite to the base film 2 (surface opposite to the side where the base film 2 is layered) of the base material 1 for a printed circuit. The base material 11 for a printed circuit board is a base material for a flexible printed circuit board and has flexibility. In the base material 11 for a printed circuit board, an arithmetic mean roughness (Sa) of the surface of the sintered body layer 3 that is opposite to the base film 2 is greater than or equal to 0.005 μm and less than or equal to 0.10 μm. With the exception of including the plating layer 12, the base material 11 for a printed circuit board has a configuration similar to that of the base material 1 for a printed circuit board of FIG. 1. Therefore, only the plating layer 12 will be described below.

(Plating Layer)

The plating layer 12 is directly (without interposing another layer) layered on the surface of the sintered body layer 3 that is opposite to the base film 2. The plating layer 12 is an electroplating layer that is formed by electroplating. The plating layer 12 includes a plating metal that is formed by electroplating. It is preferable that the plating metal is layered on the surface of the sintered body layer 3 that is opposite to the base film 2 and gaps of the sintered bodies constituting the sintered body layer 3 are filled with the plating metal.

Examples of the metal comprising the plating layer 12 include copper, nickel, cobalt, gold, silver, tin, and alloys of these. Among them, copper that is relatively inexpensive and has excellent etching properties is preferred. That is, the plating layer 12 is preferably formed by electro-copper plating.

The average thickness of the plating layer 12 is set depending on the configuration of a printed circuit to be manufactured, is not particularly limited, and can be, for example, greater than or equal to 1 μm and less than or equal to 100 μm.

In the base material 11 for a printed circuit board, the arithmetic mean roughness (Sa) of the surface of the sintered body layer 3 that is opposite to the base film 2 is within the above described range, and the sintered body layer 3 is densely formed. Therefore, in the base material 11 for a printed circuit board, an electroplating layer is directly formed, without an electroless plating layer, on the surface of the sintered body layer 3 that is opposite to the base film 2. In a case in which an electroless plating layer is layered on the surface of the sintered body layer 3 that is opposite to the base film 2, the palladium content in the vicinity of the one side surface of the base film 2 tends to increase due to effects of a palladium catalyst used in electroless plating. On the other hand, when an electroplating layer is directly layered on the surface of the sintered body layer 3 that is opposite to the base film 2, the palladium content in the vicinity of the one side surface of the base film 2 is easily reduced.

Third Embodiment

<Printed Circuit Board>

Figure 3:
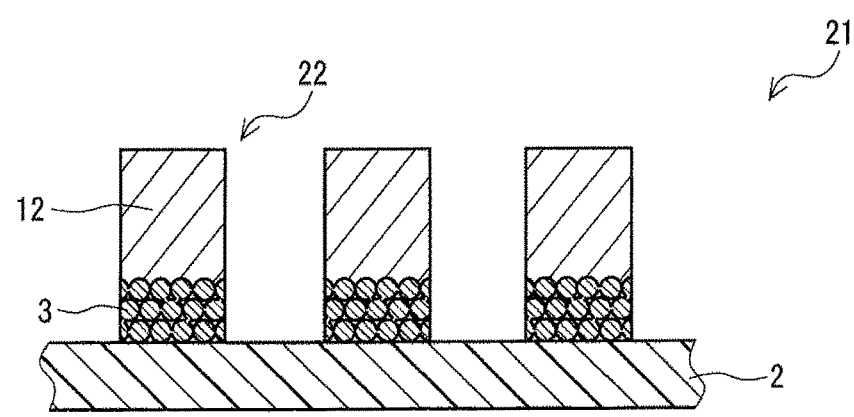
FIG. 3 is a schematic cross-sectional view illustrating a printed circuit board using the base material for a printed circuit board of FIG. 2.

A printed circuit board 21 of FIG. 3 includes: an insulating base film 2; a sintered body layer 3 of metal particles layered on one side surface of the base film 2; and a plating layer 12 that is layered on a surface of the sintered body layer 3 that is opposite to the base film 2, wherein the sintered body layer 3 and the plating layer 12 are patterned in plan view. Specifically, the printed circuit board 21 uses the base material 11 for a printed circuit board of FIG. 2, in which the sintered body layer 3 and the plating layer 12 are layered in this order on the one side surface of the base film 2. The printed circuit board 21 has a conductive pattern 22 obtained by patterning a layered structure of the sintered body layer 3 and the plating layer 12. As a patterning method at this time, for example, a method (subtractive method) in which a layered structure is masked with a resist pattern or the like and etched can be used. The printed circuit board 21 is a flexible printed circuit board and has flexibility.

Because the printed circuit board 21 uses the base material 11 for a printed circuit board as described above, the arithmetic mean roughness (Sa) of the surface of the sintered body layer 3 that is opposite to the base film 2 is greater than or equal to 0.005 μm and less than or equal to 0.10 μm.

According to the printed circuit board 21, because the arithmetic mean roughness (Sa) of the surface of the sintered body layer 3 that is opposite to the base film 2 is within the above range, the metal particles constituting the sintered body layer 3 are densely disposed with a high density. Therefore, in the printed circuit board 21, the resistance of the sintered body layer 3 is small. Also, because the interface between the base film 2 and the sintered body layer 3 is densely formed, the printed circuit board 21 is excellent in adhesion of the base film 2 and the sintered body layer 3.

<Method of Manufacturing Base Material for Printed Circuit Board>

Next, a method of manufacturing the base material 1 for a printed circuit board of FIG. 1 will be described with reference to FIG. 4A to FIG. 4C. The method of manufacturing the base material for a printed circuit board includes a step of applying an alkali treatment on the one side surface of the base film 2 (an alkali treatment step); a step of applying a conductive ink containing the metal particles 31 to the surface of the base film 2 to which the alkali treatment has been applied, to form a coating film 32a on the surface of the base film 2, to which the alkali treatment has been applied (a coating film formation step); a step of drying the coating film 32a formed in the coating film formation step (a drying step); and a step of forming the sintered body layer 3 of the metal particles 31 by sintering the coating film 32b after the drying step (a sintered body layer formation step). In the following, an example will be described in which the main component of the base film 2 is a polyimide.

According to the method of manufacturing the base material for a printed circuit board, by including a drying step, it is possible to suppress aggregation of the metal particles 31 contained in the coating film 32a. Therefore, the method of manufacturing the base material for a printed circuit board can achieve densification of the coating film 32b after the drying step. Thereby, according to the method of manufacturing the base material for a printed circuit board, it is possible to adjust the arithmetic mean roughness (Sa) of the surface of the sintered body layer 3 that is opposite to the base film 2 to be greater than or equal to 0.005 μm and less than or equal to 0.10 μm, and it is possible to manufacture the base material 1 for a printed circuit board including the sintered body layer 3 having a low resistance and having an excellent adhesion with the base film 2.

(Alkaline Treatment Step)

In the alkali treatment step, by causing an alkali liquid to contact the one side surface of the base film 2, a portion of the imide rings of the polyimide of the surface layer of the one side surface of the base film 2 is opened. The lower limit of the ring opening rate of the imide rings of the polyimide of the surface layer of the one side surface of the base film 2 opened in the alkaline treatment step is preferably 10% and is more preferably 15%. The upper limit of the ring opening rate of the imide rings is preferably 30% and is more preferably 25%.

Examples of an alkali liquid that is used in the alkali treatment step include an aqueous solution such as sodium hydroxide, potassium hydroxide, ammonia, calcium hydroxide, tetramethylammonium hydroxide, lithium hydroxide, and monoethanolamine, and an aqueous solution of these with hydrogen peroxide, and generally an aqueous solution of sodium hydroxide is used.

The pH of the alkali liquid that is used in the alkali treatment step can be, for example, greater than or equal to 12 and less than or equal to 15. Also, the contact time with the alkali liquid of the base film 2 can be, for example, greater than or equal to 15 seconds and less than or equal to 10 minutes. The temperature of the alkali liquid can be, for example, greater than or equal to 10° C. and less than or equal to 70° C.

It is preferable that the alkali treatment step include a water washing step of washing the base film 2 with water. In the water washing step, the base film 2 is washed with water to remove the alkali liquid adhering on the surface of the base film 2. Also, it is further preferable that the alkali treatment step include a step of drying the washing water after the water washing step. By vaporizing water components in the base film 2, ions in the base film 2 can be precipitated as metal or metal oxide, or bonded to resin components of the base film 2, thereby stabilizing the quality of the base film 2.

(Coating Film Formation Process)

Figure 4A:
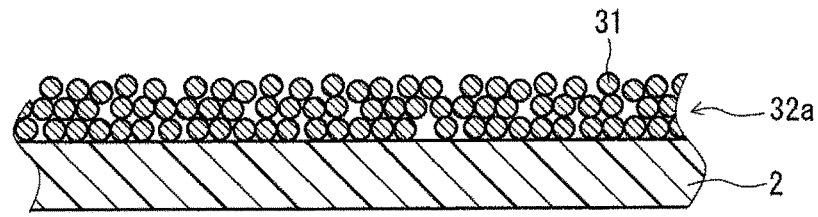
FIG. 4A is a schematic cross-sectional view illustrating a coating film formation step of a method of manufacturing the base material for a printed circuit board of FIG. 1.

In the coating film formation step, as illustrated in FIG. 4A, a conductive ink including the metal particles 31 is applied to the one side surface of the base film 2 to form the coating film 32a.

<Metal Particles>

The metal particles 31 to be dispersed in the ink can be manufactured by a high temperature treatment, a liquid phase reduction method, a gas phase method, or the like. Particularly, by the liquid phase reduction method, the manufacturing cost can be further reduced, and the particle sizes of the metal particles 31 can be made easily uniform by stirring in an aqueous solution or the like. The metal particles 31 are manufactured by a high-temperature treatment method, a liquid phase reduction method, a gas phase method, or the like to adjust the average particle size, for example, to be greater than or equal to 10 nm and less than or equal to 40 nm. It should be noted that the "average particle size" means a particle size at which a volume integrated value is 50% in a particle size distribution measured by laser diffraction method.

In order to manufacture metal particles 31 by a liquid phase reduction method, for example, a dispersant and a water-soluble metal compound to be an origin of metal ions that form the metal particles 31 are dissolved in water and a reducing agent is added to cause a reduction reaction with the metal ions for a certain period of time. In the case of the liquid phase reduction method, the manufactured metal particles 31 have uniform spherical or granular shapes and can be fine particles. As the water-soluble metal compound to be the origin of the metal ions, for example, in the case of copper, copper(II) nitrate ($Cu(NO_3)_2$), copper(II) sulfate pentahydrate ($CuSO_4 \cdot 5H_2O$), or the like can be used. In the case of silver, silver(I) nitrate ($AgNO_3$), silver methanesulfonate ($CH_3SO_3Ag$), or the like, in the case of gold, hydrogen tetrachloroaurate(III) tetrahydrate ($HAuCl_4 \cdot 4H_2O$), or the like, can be used. In the case of nickel, nickel(II) chloride hexahydrate ($NiCl_2 \cdot 6H_2O$) nickel (II) nitrate hexahydrate ($Ni(NO_3)_2 \cdot 6H_2O$), or the like can be used. For other metal particles, water-soluble compounds such as chlorides, nitrate compounds, and sulfate compounds can also be used.

As the reducing agent, various reducing agents capable of reducing metal ions in the reaction system of a liquid phase (aqueous solution) can be used. Examples of the reducing agent include sodium borohydride, sodium hypophosphite, hydrazine, transition metal ions such as trivalent titanium ions and divalent cobalt ions, ascorbic acid, reducing sugars such as glucose and fructose, polyhydric alcohols such as ethylene glycol and glycerol, and the like. Among them, trivalent titanium ions are preferable as a reducing agent. It should be noted that the liquid phase reduction method using trivalent titanium ions as a reducing agent is referred to as a titanium redox method. In the titanium redox method, metal ions are reduced by the oxidation-reduction effect when trivalent titanium ions are oxidized to tetravalent titanium ions such that metal particles are precipitated. Metal particles 31 that are obtained by the titanium redox method have small and uniform particle sizes. Therefore, the metal particles 31 are more densely packed, and a coating film 32b and a coating film 32b obtained by drying the coating film 32a (hereinafter, also referred to simply as the "coating film 32" including both the coating film 32a and the coating film 32b) are easily formed into a denser film.

To adjust the particle sizes of the metal particles 31, the types and the mixing ratio of the metal compound, the dispersant, and the reducing agent may be adjusted, and the stirring rate, the temperature, the time, the pH, and the like at the time of subjecting the metal compound to a reduction reaction may be adjusted. The lower limit of the pH of the reaction system is preferably 7, and the upper limit of the pH of the reaction system is preferably 13. By setting the pH of the reaction system in the above described range, it is possible to obtain metal particles 31 having minute particle sizes. At this time, by using a pH modifier, it is easy to adjust the pH of the reaction system in the range described above. Examples of the pH modifier that can be used include common acids and alkalis, such as hydrochloric acid, sulfuric acid, sodium hydroxide, sodium carbonate, and ammonia. In particular, to prevent the degradation of peripheral members, nitric acid and ammonia, which does not contain impurity elements such as alkali metals, alkaline-earth metals, halogen elements such as chlorine, sulfur, phosphorus, and boron, are preferable.

The lower limit of the average particle size of the metal particles 31 is preferably 10 nm and is more preferably 15 nm. The upper limit of the average particle size of the metal particles 31 is preferably 40 nm and is more preferably 35 nm. When the average particle size of the metal particles 31 is smaller than the lower limit, the dispersibility and stability of the metal particles 31 in the ink may decrease. When the average particle size of the metal particles 31 exceeds the above upper limit, the metal particles 31 may be easily precipitated, and the density of the metal particles 31 may be uneven when the ink is applied.

The lower limit of the content rate of the metal particles 31 in the ink is preferably 5% by mass, is more preferably 10% by mass, and is further more preferably 20% by mass. Also, the upper limit of the content rate of the metal particles 31 in the ink is preferably 50% by mass, is more preferably 40% by mass, and is further more preferably 30% by mass. By setting the content rate of the metal particles 31 to be greater than or equal to the lower limit as described above, the coating film 32 can be formed into a denser film. When the content rate of the metal particles 31 exceeds the upper limit as described above, the film thickness of the coating film 32 may be uneven.

<Other Components>

The ink may contain a dispersant other than metal particles 31. As a dispersant, various dispersants that can satisfactorily disperse the metal particles 31 can be used without being particularly limited.

To prevent the degradation of peripheral members, the dispersant preferably does not contain sulfur, phosphorus, boron, halogen and alkali. Preferable examples of the dispersant include nitrogen-containing polymeric dispersants such as polyethyleneimine and polyvinylpyrrolidone; hydrocarbon-based polymeric dispersants having a carboxylic acid group in its molecule, such as polyacrylic acid and carboxymethyl cellulose; polymeric dispersants having a polar group, such as Poval (polyvinyl alcohol), styrene-maleic acid copolymers, olefin-maleic acid copolymers, and copolymers having a polyethyleneimine moiety and a polyethylene oxide moiety in one molecule thereof.

The lower limit of the molecular weight of the dispersant is preferably 2,000, and the upper limit of the molecular weight of the dispersant is preferably 54,000. By using the dispersant having a molecular weight within the range described above, it is possible to disperse the metal particles 31 satisfactorily in the conductive ink, and it is possible to make the film quality of the coating film 32 dense and defect-free. When the molecular weight of the dispersant is less than the lower limit, the effect of preventing the aggregation of the metal particles 31 to maintain the dispersion may not be sufficiently obtained. When the molecular weight of the dispersant exceeds the upper limit, the dispersant may become excessively bulky, and at the time of sintering the coating film 32b, sintering of the metal particles 31 may be inhibited and voids may be generated. Also, when the dispersant is excessively bulky, the density of the coating film 32, and the decomposition residues of the dispersant may decrease the conductivity.

The dispersant can also be added to the ink in a state of a solution dissolved in water or a water-soluble organic solvent. In a case in which the dispersant is mixed in the ink, the lower limit of the content rate of the dispersant is preferably 1 part by mass per 100 parts by mass of the metal particles 31. The upper limit of the content rate of the dispersant is preferably 60 parts by mass per 100 parts by mass of the metal particles 31. When the content rate of the dispersant is less than the lower limit, the effect of preventing the aggregation of the metal particles 31 may be insufficient. When the content rate of the dispersant exceeds the upper limit, at the time of sintering the coating film 32b, an excessive dispersant may inhibit sintering of the metal particles 31 and voids may be generated. Further, the decomposition residues of the dispersant may remain as impurities in the sintered body layer 3 to decrease the conductivity.

For example, water can be used as the dispersion medium in the ink. In a case in which the dispersion medium is water, the lower limit of the content rate of the water is preferably 20 parts by mass with respect to 100 parts by mass of the metal particles 31. Also, the upper limit of the content rate of the water is preferably 1,900 parts by mass with respect to 100 parts by mass of the metal particles 31. Although water that is the dispersion medium serves, for example, to sufficiently swell the dispersant and to satisfactorily disperse the metal particles 31 surrounded by the dispersant, when the content rate of the water is less than the lower limit, the swelling effect of the dispersant may be insufficient. When the content rate of water exceeds the upper limit, the content rate of the metal particles 31 in the ink decreases, and a favorable sintered body layer 3 having the required thickness and density may not be formed.

As an organic solvent contained in the ink as needed, various water-soluble organic solvents can be used. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; polyhydric alcohols such as ethylene glycol and glycerin, and other esters; glycol ethers such as ethylene glycol monoethyl ether and diethylene glycol monobutyl ether, and the like.

The content rate of the water-soluble organic solvent is preferably greater than or equal to 30 parts by mass and less than or equal to 900 parts by mass per 100 parts by mass of the metal particles. When the content rate of the water-soluble organic solvent is less than the lower limit, the effects by the organic solvent of adjusting the viscosity and adjusting the vapor pressure of the dispersion liquid may not be sufficiently obtained. When the content rate of the water-soluble organic solvent exceeds the upper limit, the effect by water of swelling the dispersant may be insufficient, and aggregation of the metal particles 31 in the ink may occur.

In the case of manufacturing the metal particles 31 by the liquid-phase reduction method, the metal particles 31 precipitated in a liquid-phase reaction system (aqueous solution) can be prepared by using an ink that has been made into a powder through steps of filtration, washing, drying, disintegration, and the like. In this case, the powdery metal particles 31, water or the like that is a dispersion medium, optionally, a dispersant, and a water-soluble organic solvent can be mixed at predetermined proportions to prepare a conductive ink containing the metal particles 31. At this time, it is preferable to prepare the ink with a liquid phase (aqueous solution), in which the metal particles 31 have been precipitated, as a starting material. Specifically, the liquid phase (aqueous solution) containing the precipitated metal particles 31 is subjected to treatment, such as ultrafiltration, centrifugal separation, washing with water, or electrodialysis, to remove impurities and, optionally, is concentrated to remove water. Alternatively, after water is added to adjust the concentration of the metal particles 31, and, optionally, a water-soluble organic solvent is further added at a predetermined proportion, thereby preparing a conductive ink containing the metal particles 31. By this method, it is possible to prevent generation of coarse and irregular particles due to aggregation at the time of drying the metal particles 31, and it is easy to form a dense and uniform sintered body layer 3.

<Application Method of Ink>

As a method of applying a conductive ink in which the metal particles 31 are dispersed to the one side surface of the base film 2, a known application method, such as a spin coating method, a spray coating method, a bar coating method, a die coating method, a slit coating method, a roll coating method, or a dip coating method, can be used. Also, the conductive ink may be applied to only part of the one side surface of the base film 2 by screen printing, a dispenser, or the like.

(Drying Step)

Figure 4B:
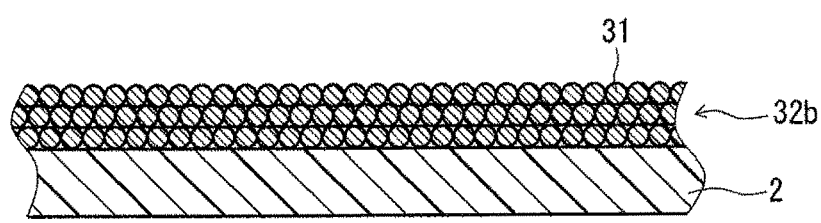
FIG. 4B is a schematic cross-sectional view illustrating a drying step of the method of manufacturing the base material for a printed circuit board of FIG. 1.

In the drying step, as illustrated in FIG. 4B, the dispersion medium contained in the coating film 32a is dried before the aggregation of the metal particles 31 contained in the coating film 32a formed in the coating film formation step is promoted. In the drying step, for example, the dispersion medium contained in the coating film 32a is dried by blowing air at room temperature.

For example, the interval from the formation of the coating film 32a to the start of the drying step is preferably less than or equal to 60 seconds and is more preferably less than or equal to 50 seconds.

The lower limit of the drying temperature in the drying step is preferably 5° C. and is more preferably 10° C. The upper limit of the drying temperature is preferably 90° C. and is more preferably 85° C. When the drying temperature is lower than the lower limit as described above, the drying time for sufficiently drying the dispersion medium may be prolonged, and it may be impossible to reliably suppress aggregation of the metal particles 31. When the drying temperature exceeds the upper limit as described above, the metal particles 31 may aggregate and a smooth coating film 32b may not be formed.

The lower limit of the drying time in the drying step is preferably 5 seconds and is more preferably 10 seconds. The upper limit of the drying time in the drying step is preferably 60 seconds and is more preferably 50 seconds. When the drying time is less than the lower limit as described above, the dispersion medium may not be sufficiently dried. When the drying time exceeds the upper limit as described above, the drying time may be unnecessarily prolonged, or even when the dispersion medium is sufficiently dried by the drying step, the aggregation of the metal particles 31 may not be sufficiently suppressed.

(Sintered Body Layer Formation Step)

Figure 4C:
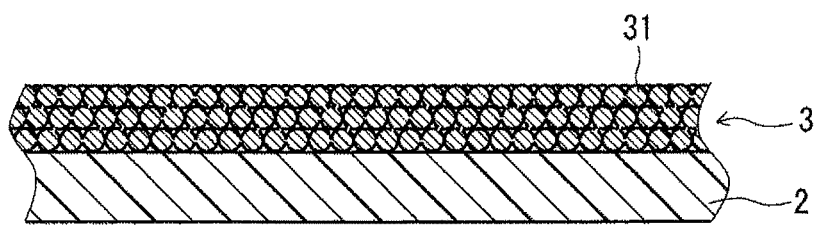
FIG. 4C is a schematic cross-sectional view illustrating a sintered body layer formation step of the method of manufacturing the base material for a printed circuit board of FIG. 1.

In the sintered body layer formation step, as illustrated in FIG. 4C, the sintered body layer 3 of the metal particles 31 is formed by sintering the coating film 32b.

<Sintering>

By sintering, the metal particles 31 are sintered with each other and the sintered bodies are adhered to the one side surface of the base film 2. Also, in the vicinity of the interface of the sintered bodies with the base film 2, because the metal particles 31 are oxidized by sintering, while suppressing generation of a metal hydroxide based on the metal particles 31 and a group derived from the metal hydroxide, a metal oxide based on the metal particles 31 and a group derived from the metal oxide are generated. The metal oxide and the group derived from the metal oxide generated in the vicinity of the interface of the sintered bodies with the base film 2 are strongly bonded to ring opening portions of the imide rings of the polyimide constituting the base film 2, and therefore the adhesion between the base film 2 and the sintered bodies increases.

The sintering is preferably performed in an atmosphere containing a certain amount of oxygen in order to prompt oxidation of the metal particles 31 in the vicinity of the interface of the sintered bodies with the base film 2. In this case, the lower limit of the oxygen concentration in the sintering atmosphere is preferably 1 ppm by volume, and is more preferably 10 ppm by volume. The upper limit of the oxygen concentration is preferably 10,000 ppm by volume, and is more preferably 1,000 ppm by volume. When the oxygen concentration is less than the lower limit as described above, the amount of the metal oxide and the group derived from the metal oxide generated in the vicinity of the interface of the sintered bodies with the base film 2 may decrease, and the adhesion between the base film 2 and the sintered bodies may not be sufficiently enhanced. When the oxygen concentration exceeds the upper limit as described above, the metal particles 31 may be excessively oxidized, and the conductivity of the sintered bodies may decrease.

The lower limit of the sintering temperature is preferably 150° C., and is more preferably 200° C. The upper limit of the sintering temperature is preferably 500° C., and is more preferably 400° C. When the sintering temperature is lower than the lower limit as described above, the amount of the metal oxide and the group derived from the metal oxide generated in the vicinity of the interface of the sintered bodies with the base film 2 may be decrease, and the adhesion between the base film 2 and the sintered bodies may not be sufficiently enhanced. When the sintering temperature exceeds the upper limit as described above, the base film 2 may deform. It should be noted that the sintering time is not particularly limited, but may be, for example, in a range of greater than or equal to 30 minutes and less than or equal to 600 minutes.

Figure 4D:
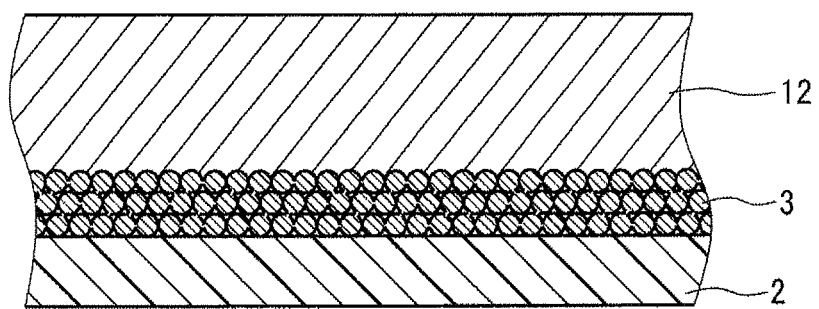
FIG. 4D is a schematic cross-sectional view illustrating a plating layer layering step of a method of manufacturing the base material for a printed circuit board of FIG. 2.

Next, a method of manufacturing the base material 11 for a printed circuit board of FIG. 2 will be described with reference to FIG. 4D. The method of manufacturing the base material for a printed circuit board includes a step of layering a plating layer 12 on the surface of the sintered body layer 3 that is formed by the sintered body layer formation step and that is opposite to the base film 2 (the plating layer layering step).

(Plating Layer Layering Step)

In the plating layer layering step, by electroplating, the plating layer 12 is layered on the surface of the sintered body layer 3 that is opposite to the base film 2. In the method of manufacturing the base material for a printed circuit board, because the sintered body layer 3 is sufficiently dense, it is possible to layer an electroplating layer directly on the surface of the sintered body layer 3 that is opposite to the base film 2 without interposing an electroless plating layer. Examples of a metal that is used for electroplating in the plating layer layering step include copper, nickel, cobalt, gold, silver, tin, and the like, and in particular, copper is preferable. The procedure of the electroplating is not particularly limited and may be suitably selected from known electroplating baths and plating conditions, for example. In the electroplating layer formation step, the thickness of the conductive pattern 22 of the printed circuit board 21 of FIG. 3, which is formed using the base material 11 for a printed circuit board, is adjusted to be a desired thickness.

Other Embodiments

The embodiments disclosed above should be considered exemplary in all respects and not limiting. The scope of the present invention is not limited to configurations of the above described embodiments, but is indicated by claims and is intended to include all changes within the meaning and scope of equivalence with the claims.

For example, in the base material for a printed circuit board, a sintered body layer of metal particles may not be formed only one surface of the base film, and a sintered body layer of metal particles may be layered on both surfaces of the base film.

The base material for a printed circuit board need not necessarily be a base material for a flexible printed circuit board, but may be rigid base material. In this case, examples of the main component of a base film include hard materials, such as paper phenol, paper epoxy, glass composite, glass epoxy, and glass base material; rigid-flexible materials in which hard materials and soft materials are combined, and the like.

As long as the sintered body layer of metal particles is layered on the one side surface of the base film and the arithmetic mean roughness (Sa) of the surface of the sintered body layer that is opposite to the base film is within the above described range, the specific configuration of a layer to be layered on the surface of the sintered body layer that is opposite to the base film is not particularly limited. In the base material for a printed circuit board, for example, an electroless plating layer may be layered on the surface of the sintered body layer that is opposite to the base film.

The method of manufacturing a base material for a printed circuit board need not necessarily include an alkali treatment step.

The method of manufacturing a base material for a printed circuit board does not necessarily need to suppress aggregation of the metal particles contained in the coating film by the drying step. For example, an aggregation inhibitor may be used to suppress the aggregation of the metal particles. Also, even in a case in which a drying step is performed, it is not necessarily required to dry by blowing air at room temperature, and it is possible to dry by heating.

The printed circuit board can be formed using, for example, the base material 1 for a printed circuit board of FIG. 1.

In the printed circuit board, a conductive pattern may be formed by a semi-additive method.

EXAMPLES

Although the present invention will be described below in detail with reference to Examples, the present invention is not limited to the Examples.

[No. 1]

80 g (0.1 M) of a titanium trichloride solution as a reducing agent, 50 g of sodium carbonate as a pH modifier, 90 g of sodium citrate as a complexing agent, and 1 g of polyethyleneimine-polyethyleneoxide adduct as a dispersant were dissolved in 1 L of pure water in a beaker, and the aqueous solution was kept at 35° C. Also, to the aqueous solution, 10 g (0.04 M) of an aqueous solution of copper nitrate trihydrate kept at the same temperature (35° C.) was added and stirred so that copper fine particles were precipitated. Furthermore, with respect to the copper fine particles separated by centrifugation, repeating a water washing step by 200 mL of pure water twice and then drying the copper fine particles, powdered copper fine particles were obtained. Subsequently, a conductive ink for forming a sintered body layer was obtained by adjusting the concentration by adding pure water to the powdered fine copper particles. 480 μL of this conductive ink was applied, by a bar coating method, to one side surface of a polyimide film (20 cm square) subjected to a hydrophilic treatment. The coating film formed by application of the conductive ink was dried by air blow at room temperature (25° C.) at the drying time of Table 1. The drying was started immediately (within one second) after the formation of the coating film. After water in the coating film was evaporated by this drying, the coating film was sintered at the sintering temperature of 350° C. for 2 hours. Thereby, No. 1 of a base material for a printed circuit board in which the sintered body layer was layered on the one side surface of the base film (polyimide film) was manufactured.

[No. 2 to No. 8]

With the exception of setting the drying time of coating film as in Table 1, No. 2 to No. 8 of base materials for printed circuit boards were manufactured similarly to No. 1.

(Arithmetic Mean Roughness)

For each of No. 1 to No. 8, the arithmetic mean roughness (Sa) of the surface of the sintered body layer that is opposite to the base film (the opposite surface of the layered surface with the base film) of the base material for a printed circuit board was measured using a laser electron microscope "VK-X150" manufactured by Keyence Corporation with a 100× objective lens and a 1× digital zoom with a measurement range of 30 μm×30 μm and a cutoff value of 90. The measured results are indicated in Table 1.

(Average Particle Size of Copper Particle Sintered Bodies)

For each of No. 1 to No. 8, the average particle size of copper particle sintered bodies constituting the sintered body layer of the base material for a printed circuit board was measured by a scanning electron microscope ("SU8020" manufactured by Hitachi High-Tech Corporation). The measured results are indicated in Table 1.

(Ring Opening Rate of Imide Rings)

Using a Fourier transform infrared total reflection absorption measurement (FT-IR) device "Nicolet8700" manufactured by Thermo Fisher Scientific K.K., using a single-reflection ATR accessory "Dura Scope" (diamond prism) manufactured by SensIR cooperation, setting the absorption intensity spectrum in the range of the measurement wave number of 4000 to 650 $cm^{-1}$ at the incident angle of 45° to 16 times as the number of times of integration (the number of scans), setting the resolution to 4 $cm^{-1}$ for measurement, calculating, from the obtained absorption intensity spectrum, the ratio of the peak intensity at the wave number of 1705 $cm^{-1}$ to the peak intensity at the wave number of 1494 $cm^{-1}$, and converting the ratio of the peak intensity of the base film not subjected to the surface treatment to 100%, for each of No. 1 to No. 8, the ring opening rate of the imide rings of the polyimide of the surface layer of the surface of the base film where the sintered body layer was layered of the base material for a printed circuit board was obtained. The ring opening rate of the imide rings are indicated in Table 1.

(Palladium Content)

For each of No. 1 to No. 8, the content of palladium in the vicinity of the surface of the base film where the sintered body layer was layered of the base material for a printed circuit board was measured using an ICP emission spectroscopy "iCAP6300" manufactured by Thermo Fisher Scientific K.K. The measurement results are indicated in Table 1.

<Peel Strength>

For each of No. 1 to No. 8, the peel strength between the base film and the sintered body layer of the base material for a printed circuit board was measured by a 180° peeling test in accordance with JIS-C6471 (1995). The measured results of peeling strength are indicated by Table 1.

TABLE 1

| | DRYING TIME [sec.] | ARITHMETIC MEAN ROUGHNESS (Sa) [μm] | AVERAGE PARTICLE SIZE [nm] | IMIDE RING OPENING RATE [%] | PALLADIUM CONTENT [mg/m$^2$] | PEEL STRENGTH [N/cm] |
|---|---|---|---|---|---|---|
| No. 1 | 10 | 0.009 | 104 | 20 | <1 | 9.7 |
| No. 2 | 20 | 0.018 | 99 | 21 | <1 | 8.6 |
| No. 3 | 40 | 0.064 | 86 | 20 | <1 | 7.5 |
| No. 4 | 60 | 0.099 | 92 | 21 | <1 | 7.0 |
| No. 5 | 20 | 0.032 | 87 | 29 | <1 | 7.2 |
| No. 6 | 20 | 0.022 | 98 | 11 | <1 | 7.0 |
| No. 7 | 20 | 0.051 | 269 | 21 | <1 | 7.0 |
| No. 8 | 90 | 0.144 | 88 | 21 | <1 | 4.3 |

<Evaluation Results>

As indicated in Table 1, for each of No. 1 to No. 7, the base material for a printed circuit board, in which the arithmetic mean roughness (Sa) of the surface of the sintered body layer that is opposite to the base film is greater than or equal to 0.005 μm and less than or equal to 0.10 μm, has a high peel strength of 7.0 N/cm or more and is excellent in adhesion of the base film and the sintered body layer. In particular, for each of No. 1 and No. 2, the base material for a printed circuit board, in which the arithmetic mean roughness (Sa) of the surface of the sintered body layer that is opposite to the base film is less than or equal to 0.018 μm, has a high peel strength of 8.6 N/cm or more, and the adhesion of the base film and the sintered body layer is increased further. Also, because No. 5 of the base material for a printed circuit board has a relatively high ring opening rate of the imide rings of the polyimide of the surface layer of the surface of the base film where the sintered body layer is layered, in combination with the arithmetic mean roughness (Sa) of the surface of the sintered body layer that is opposite to the base film being less than or equal to 0.10 μm, the peel strength between the base film and the sintered body layer is increased. Further, for each of No. 1 to No. 7, the base material for a printed circuit board has an arithmetic mean roughness (Sa) of the surface of the sintered body layer that is opposite to the base film 0.10 μm or less and the sintered body layer is sufficiently dense, and therefore the resistance of the sintered body layer is low. On the other hand, No. 8 of the base material for a printed circuit board, in which the arithmetic mean roughness (Sa) of the surface of the sintered body layer that is opposite to the base film exceeds 0.10 μm, has a low peel strength of 4.3 N/cm, and the adhesion of the base film and the sintered body layer is insufficient. Also, because No. 8 of the base material for a printed circuit board has the arithmetic mean roughness (Sa) of the surface of the sintered body layer that is opposite to the base film exceeding 0.10 μm, the density of the sintered body layer is insufficient and the resistance of the sintered body layer is not easily sufficiently reduced.

DESCRIPTION OF THE REFERENCE NUMERALS 1, 11, 21 base material for a printed circuit board
2 base film
3 sintered body layer
12 plating layer
21 printed circuit board
22 conductive pattern
31 metal particles
32a and 32b coating film

The invention claimed is:

1. A base material for a printed circuit board comprising:
   an insulating base film, and
   a sintered body layer of metal particles made by sintering and layered on one surface of the base film, the sintered body layer consisting essentially of sintered metal particles;
   wherein the metal particles of the sintered body layer are directly bonded together, and the directly bonded metal particles directly adhere to the one surface of the base film, and
   wherein an arithmetic mean roughness (Sa) of a surface of the sintered body layer that is opposite to the base film is greater than or equal to 0.009 μm and less than or equal to 0.05 μm, and an average particle size of the sintered body is less than 200 nm.

2. The base material for a printed circuit board according to claim 1, wherein sintered bodies constituting the sintered body layer are copper particle sintered bodies and an average particle size of the copper particle sintered bodies is greater than or equal to 50 nm.

3. The base material for a printed circuit board according to claim 1,
   wherein a main component of the base film is a polyimide, and
   wherein a ring opening rate of imide rings of the polyimide of a surface layer of the one surface of the base film is greater than or equal to 10% and less than or equal to 30%.

4. The base material for a printed circuit board according to claim 1, wherein a content of palladium in a vicinity of the one surface of the base film is less than or equal to 1.0 mg/m$^2$.

5. The base material for a printed circuit board according to claim 1, wherein the sintered body layer includes a metal oxide of the metal particles at an interface between the sintered body layer and the insulating base film, the metal oxide being bonded to the insulating base film.

6. The base material for a printed circuit board according to claim 1, wherein the average particle size of the sintered body is less than 104 nm.

7. A printed circuit board comprising:
   an insulating base film;
   a sintered body layer of metal particles made by sintering and layered on one surface of the base film, the sintered body layer consisting essentially of sintered metal particles; and
   a plating layer that is layered on a surface of the sintered body layer that is opposite to the base film,
   wherein the metal particles of the sintered body layer are directly bonded together, and the directly bonded metal particles directly adhere to the one surface of the base film,
   wherein the sintered body layer and the plating layer are patterned in plan view, and
   wherein an arithmetic mean roughness (Sa) of the surface of the sintered body layer that is opposite to the base film is greater than or equal to 0.009 μm and less than or equal to 0.05 μm, and an average particle size of the sintered body is less than 200 nm.

* * * * *